United States Patent [19]

Fisher

[11] 4,454,485
[45] Jun. 12, 1984

[54] LOW DISTORTION FET OSCILLATOR WITH FEEDBACK LOOP FOR AMPLITUDE STABILIZATION

[75] Inventor: Eldon M. Fisher, Acton, Mass.

[73] Assignee: The United States of America as represented by the Secretary of the Army, Washington, D.C.

[21] Appl. No.: 290,264

[22] Filed: Aug. 5, 1981

[51] Int. Cl.³ .............................................. H03B 5/12
[52] U.S. Cl. ............................... 331/109; 331/117 FE
[58] Field of Search ................. 331/183, 109, 117 FE, 331/117 R

[56] References Cited

U.S. PATENT DOCUMENTS

| | | | |
|---|---|---|---|
| 3,416,096 | 12/1968 | Kim | 331/117 FE X |
| 3,513,408 | 5/1970 | McGee | 331/117 FE X |
| 3,534,294 | 10/1970 | Auer | 331/117 FE |
| 3,624,541 | 11/1971 | Lundstrom | 331/109 |
| 4,321,563 | 3/1982 | Lesarte | 331/117 FE |

OTHER PUBLICATIONS

Farell, "Designing FET Oscillators", EEE-Circuit Design Engineering, Jan. 1967, pp. 86-90, 331-117 FE.
Brown, "MOS FET Stabilizes Oscillator's Output", Electronics, Feb. 3, 1969, p. 80, 331-117 FE.

*Primary Examiner*—Siegfried H. Grimm
*Attorney, Agent, or Firm*—Anthony T. Lane; Jeremiah G. Murray; Edward Goldberg

[57] ABSTRACT

An FET oscillator includes means for controlling the gain of the oscillator to control its output level to thereby avoid limiting, and thus to reduce distortion of the oscillator output. A feedback loop is serially connected between the drain and gate electrodes to cause the gate direct voltage to increase negatively as drain output amplitude increases and thus reduce drain current and stabilize oscillator gain. The level of oscillation is adjustable by a potentiometer connection to the gate.

8 Claims, 2 Drawing Figures

LOW DISTORTION FET OSCILLATOR WITH FEEDBACK LOOP FOR AMPLITUDE STABILIZATION

U.S. GOVERNMENT RIGHTS

The Government has rights in this invention pursuant to Contract No. DAAB07-77-C-3298, awarded by the Department of the Army.

BACKGROUND OF THE INVENTION

Present FET (field effect transistor) circuits utilized as oscillators show relatively high output amplitude variations as a function of the operating frequency or output loading. If the amplitude of the oscillator output is too high, undesired distortion may result.

Various circuits are known for controlling the output of an FET oscillator. For example, U.S. Pat. No. 3,723,905 discloses an oscillator circuit, including a dual-gate MOS FET arranged in a Hartley oscillator configuration and operated to maintain the oscillator signal output level substantially constant over a wide frequency range.

Also, various circuits are known for controlling the output of junction transistors. For example, U.S. Pat. No. 3,596,207 discloses a voltage control oscillator (VCO), which is so designed that the output pulse width can be kept substantially constant, irrespective of any variation in the input control voltage.

SUMMARY OF THE INVENTION

The present invention discloses an FET oscillator, including a means for providing a passive level control to control the gain of the transistor oscillator without introducing any distortion into the output signal.

BRIEF DESCRIPTION OF THE DRAWINGS

The foregoing features and advantages of the present invention will be apparent from the following more particular description of the invention. The accompanying drawings, listed hereinbelow, are useful in explaining the invention, wherein.

DESCRIPTION OF THE PREFERRED EMBODIMENTS

The invention oscillator circuit 11 comprises a field effect transistor (FET) 12. As is known, an FET is a majority carrier device in which the resistance of a current path from the source electrode S to drain electrode D is modulated by the voltage applied to a gate electrode G. In one type of FET, the field from the gate electrode G extends through a thin insulator into the semiconductor layer between the source and drain electrodes, thereby modifying its conductivity.

Figure 1:
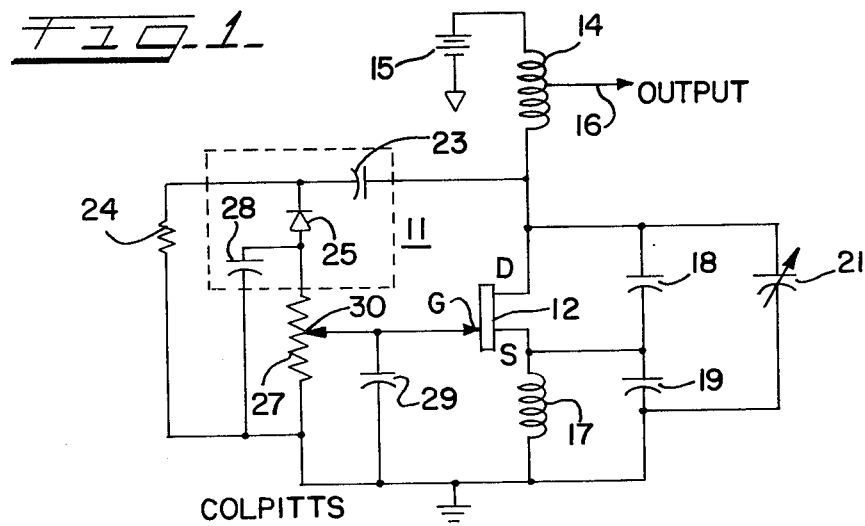
FIG. 1 shows an FET oscillator circuit, in accordance with the invention, connected in a Colpitts configuration.

In FIG. 1, the drain electrode D of FET 12 is connected through an inductor 14 to the positive terminal of a power supply 15. An output voltage, or signal, is taken from a tap 16 on inductor 14. The drain electrode D is also connected, through a capacitor 23 and a resistor 24, to ground reference. A unilateral conducting device comprising a diode 25 has its cathode connected to the junction of capacitor 23 and resistor 24, and its anode connected, through a resistor (potentiometer) 27 which has a variable wiper (tap) 30, to ground reference. A capacitor 28 is connected in parallel across resistor 27.

The source electrode S of FET 12 is connected, through an inductor 17, to ground reference. Inductor 17, which is not a frequency-determining component, allows high DC gain for the stabilization loop. A pair of capacitors 18 and 19 are connected in series from the drain electrode D to ground reference. The junction of capacitors 18 and 19 connects to the source electrode S. A variable capacitor 21 is connected in parallel with capacitors 18 and 19.

As can be readily appreciated, the circuit of FIG. 1 comprises a Colpitts-type oscillator, wherein the feedback loop includes the two capacitors 18 and 19, which form a voltage divider that serves to control the feedback from the drain electrode to the source electrode of the FET. Inductor 17 is chosen to be well beyond self-resonance at the oscillation frequency, and increases the net capacitance to ground from the FET source. Capacitor 21 may be a voltage-variable device, so that the oscillator may be a VCO (voltage-controlled oscillator). Capacitors 23 and 29 are chosen to be AC short circuits at the oscillation frequency.

One unique feature of the inventive oscillator is in its economy of components. The inventive oscillator of FIG. 1, in effect, uses just three more components (indicated by those components within the dotted lines of FIG. 1) than a rudimentary or basic oscillator in common use. Yet the inventive circuit maintains the FET 12 in a linear operating condition at all times, thus greatly reducing output distortion. An additional benefit is that output power is relatively insensitive to tuning, temperature or power supply voltage. This is possible only if an FET is used since its common source input, for the stabilization, does not load down the passive control circuitry.

Figure 2:
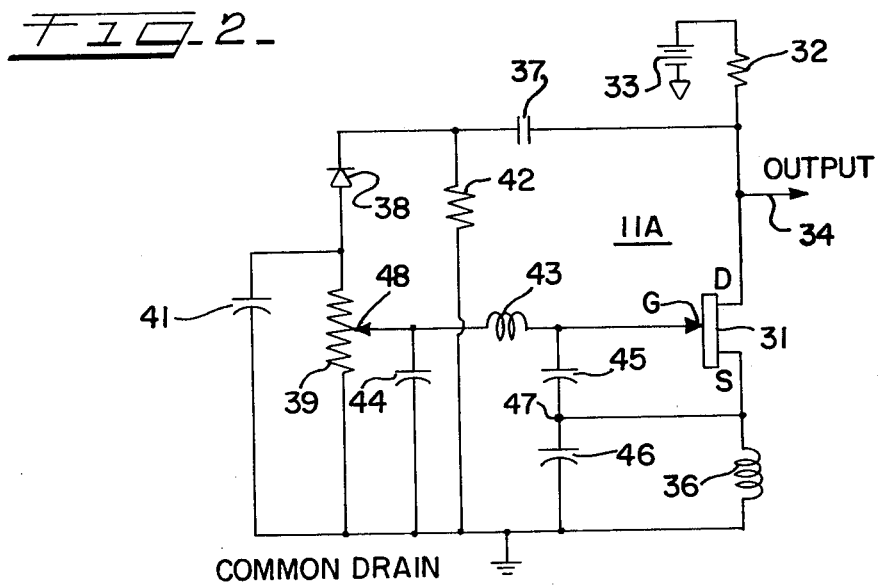
FIG. 2 shows an FET oscillator circuit, in accordance with the invention, connected in a common drain or common collector configuration.

Refer now to FIG. 2, which shows a variation of the inventive oscillator circuit 11A, wherein the FET 31 is connected in a common collector or common drain configuration. In FIG. 2, the drain electrode D is connected through a resistor 32 to power supply 33. The output of the circuit 11A is taken from the drain electrode D, as indicated at 34. Drain electrode D is also connected, through a capacitor 37, a diode 38 and a resistor 39, to ground reference. A capacitor 41 is connected in parallel to the resistor 39. A resistor 42 is connected to ground from the junction of capacitor 37 and diode 38. The source electrode S is connected, through an inductor 36, to ground reference. Inductor 36 is chosen to be well beyond self-resonance at the oscillation frequency. The gate electrode of FET 31 is connected, through an inductor 43, to the tap 48 of variable resistor 39. The junction of inductor 43 and tap 48 connects, through a capacitor 44, to ground reference. Capacitors 41 and 44 are chosen to be AC short circuits, and inductor 43 is chosen to be an AC open circuit, at the oscillation frequency. The junction 47 of capacitors 45 and 46 is connected to the source electrode S.

The operation of the inventive circuitry of FIG. 1 will now be discussed. Initially, it is important to note that the FET gate has a high input impedance. Immediately following power turn-on, the FET 12 gate electrode G potential will be zero volts, causing the FET 12 to conduct its saturation current, $I_{SAT}$. The device transconductance is maximum when drain current equals $I_{SAT}$. If the oscillator loop gain is greater than 1, oscillation will commence. The amplitude of the oscillation will increase at a rate determined by the amount of excess gain and the Q of the resonator until it is limited, as will be explained.

Referring briefly to the prior art, wherein conventional bipolar transistor oscillators provide amplitude control by allowing collector-emitter saturation and/or collector cut-off, distortion of the desired signal inevitably results from that type of amplitude control. During saturation, the collector-base junction is forward biased; and the collector voltage may even be more negative (for an NPN transistor) than the emitter. Parasitic effects can cause the transistor operating point to change, resulting in frequency hopping or motorboating. These effects are especially severe if the oscillator is a VCO or if it must operate over a wide temperature range.

In contrast to the prior art, and as will be explained, the present invention controls the amplitude of the output voltage from the oscillator before a limiting of the voltage is effected. This reduces any distortion of the output. An additional benefit of the circuit is the low power consumption and the elimination of the frequency hopping and motorboating.

Capacitor 23, chosen to be an AC short circuit at the oscillation frequency, couples the drain voltage to resistor 24 and anode of diode 25. The negative swings of the drain voltage forward bias diode 25, which, in turn, causes capacitor 28 to charge to a negative voltage. A portion of the voltage across capacitor 28, determined by the adjustment of potentiometer wiper 30, controls the gate voltage of FET 12. Clearly, as the amplitude of oscillation of the drain of FET 12 increases, the DC potential of the gate G becomes more and more negative. The DC drain current and transconductance of the FET 12 thus both decrease as the level of oscillation increases. Eventually, the oscillator loop gain becomes unity; and the process stabilizes. The level of oscillation can be increased by adjusting the wiper 30 of potentiometer 27 towards ground.

Capacitor 29 is chosen to be an AC short circuit at the oscillation frequency, but small enough so that the voltage lag it induces on the wiper 30 of potentiometer 27 does not cause instability of the stabilization loop. The FET 12 (FIG. 1) operates in the common gate mode for the oscillation, and in the common source mode for the amplitude control.

With the proper choice of FET type and potentiometer adjustment, second harmonic distortion reduction of greater than 40 dB can be achieved. For instance, in one practical embodiment, the frequency of oscillation was 148 MHz; output power was −1.5 dBm; the second harmonic was down 44 dB; and the third harmonic was down 66 dB.

In another embodiment as a VCO in the 155 MHz to 180 MHz range, output power variation over the temperature range of −55° C. to +70° C. was less than 2 dB and power variation over the tuning range was less than 1 dB. Output power is insensitive to power supply variations, provided that the minimum drain voltage is greater than the FET pinch-off and maximum drain voltage is below breakdown.

Note that, in lieu of a resistor or potentiometer 27, an AC feedback control, using a variable inductance and/or variable capacitance in the feedback path, may be used to control the feedback voltage applied, such as to gate electrode G of FET 12.

The circuit of FIG. 2 functions similarly to the circuit of FIG. 1. As mentioned above, FET 12, in FIG. 1, operates in a common gate mode for the oscillation and in the common source mode for the amplitude control, while, in the FET 31 circuit of FIG. 2, the oscillation is common drain and the control, common source.

While the invention has been particularly shown and described with reference to a preferred embodiment thereof, it will be understood by those skilled in the art that various changes in form and details may be made therein without departing from the spirit and scope of the invention.

I claim:

1. An oscillator comprising, in combination: a field effect transistor having drain, source and gate electrodes; direct voltage means connected between said drain and a common reference; inductive-capacitive circuit means connected to the source and one of the other electrodes to provide output oscillations at the drain electrode at a selected frequency, said inductive-capacitive circuit means including a coil connected from the source to said common reference and a pair of capacitors connected in series between said one electrode and said reference, said source and one end of said coil being connected to the junction of said series capacitors; feedback loop means including a third capacitor, a unilateral conducting device having a cathode and an anode, and first resistance means serially connecting the drain electrode to the gate electrode to provide a gate control voltage inversely proportional to the drain output voltage amplitude, said loop further including means for adjusting the portion of the output voltage from said drain electrode coupled to said gate electrode through said loop; a fourth capacitor connected between said anode and common reference in parallel with said first resistance means; and a second resistance means connected from said cathode to said common reference; said feedback means, fourth capacitor and said second resistance means acting to control and maintain the amplitude level of said oscillations below a level causing limiting.

2. The oscillator as in claim 1, wherein said unilateral conducting device is a diode.

3. The oscillator as in claim 1, wherein an inductor, having an output tap, is connected to said drain electrode and the output of said oscillator is coupled from said tap.

4. The oscillator as in claim 1 wherein said pair of capacitors is connected between said drain electrode and said reference in a Colpitts oscillator configuration.

5. The oscillator as in claim 4 including a variable capacitor connected between said drain electrode and said reference.

6. The oscillator as in claim 1 wherein said pair of capacitors is connected between said gate electrode and said reference in a common drain configuration.

7. The oscillator as in claim 1 wherein said feedback loop means includes said third capacitor connected at one end to said drain electrode, said unilateral conducting device cathode connnected to the other end of said third capacitor, said first resistance means having one end connected to said anode of said unilateral conducting device and the other end connected to said common reference.

8. The oscillator as in claim 7 wherein said first resistance means includes a potentiometer and said means for adjusting is a variable tap on said potentiometer connected to said gate electrode, and a fifth capacitor connected between said gate electrode and said common reference.

* * * * *